US006872429B1

(12) United States Patent
Chen et al.

(10) Patent No.: US 6,872,429 B1
(45) Date of Patent: *Mar. 29, 2005

(54) DEPOSITION OF TUNGSTEN NITRIDE USING PLASMA PRETREATMENT IN A CHEMICAL VAPOR DEPOSITION CHAMBER

(75) Inventors: Ling Chen, Sunnyvale, CA (US); Seshadri Ganguli, Santa Clara, CA (US); Alfred Mak, Union City, CA (US)

(73) Assignee: Applied Materials, Inc., Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/067,429

(22) Filed: Apr. 27, 1998

Related U.S. Application Data

(63) Continuation of application No. 08/884,811, filed on Jun. 30, 1997, now Pat. No. 6,309,713.

(51) Int. Cl.[7] ............................................... H05H 1/24
(52) U.S. Cl. ..................... 427/576; 427/535; 438/785
(58) Field of Search .................... 427/533, 534, 427/535, 537, 96, 99, 255, 255.1, 576; 438/778, 785

(56) References Cited

U.S. PATENT DOCUMENTS

| 4,645,683 A | * | 2/1987 | Gourrier et al. ............ 427/535 |
|---|---|---|---|
| 4,751,101 A | * | 6/1988 | Joshi ........................... 427/535 |
| 4,847,111 A | * | 7/1989 | Chow et al. ................. 427/536 |
| 4,910,169 A | * | 3/1990 | Hoshino ...................... 427/574 |
| 4,913,929 A | * | 4/1990 | Moslehi et al. .......... 427/255.3 |
| 5,141,613 A | | 8/1992 | Adoncecchi et al. |
| 5,232,872 A | | 8/1993 | Ohba |
| 5,296,404 A | | 3/1994 | Akahori et al. |
| 5,356,835 A | | 10/1994 | Somekh et al. |
| 5,487,922 A | * | 1/1996 | Nieh et al. ................... 427/535 |
| 5,487,923 A | * | 1/1996 | Min et al. .................... 427/569 |
| 5,576,071 A | * | 11/1996 | Sandhu ........................ 427/534 |
| 5,593,511 A | | 1/1997 | Foster et al. |
| 5,620,925 A | * | 4/1997 | Nakata et al. ............... 438/641 |
| 5,633,200 A | * | 5/1997 | Hu ............................... 438/653 |
| 5,913,145 A | | 6/1999 | Lu et al. |
| 6,153,529 A | * | 11/2000 | Agarwal ...................... 438/708 |
| 6,162,715 A | * | 12/2000 | Mak et al. ................... 438/592 |

FOREIGN PATENT DOCUMENTS

| EP | 0 630 989 A2 | | 12/1994 |
|---|---|---|---|
| EP | 0630989 A2 | * | 12/1994 |
| EP | 0 711 846 A1 | | 5/1996 |
| EP | 0 778 358 A1 | | 6/1997 |
| JP | 63317676 | | 12/1988 |
| JP | 01005015 | | 1/1989 |

OTHER PUBLICATIONS

Lu et al. "A New Process for Depositing Tungsten Nitride Thin Films" *J.Electrochem. Soc.*, vol. 145, No. 2, pp. L21–L23, Feb. 1998.

* cited by examiner

*Primary Examiner*—Bret Chen
(74) *Attorney, Agent, or Firm*—Moser Patterson & Sheridan LLP.

(57) ABSTRACT

A layer of tungsten nitride is deposited on the upper surface of a wafer with improved adhesion. The deposition is performed by first pretreating the wafer with a hydrogen plasma prior to performing tungsten nitride deposition.

23 Claims, 6 Drawing Sheets

FIG. 4

DEPOSITION OF TUNGSTEN NITRIDE USING PLASMA PRETREATMENT IN A CHEMICAL VAPOR DEPOSITION CHAMBER

CROSS-REFERENCE TO RELATED APPLICATION

This application is a continuation-in-part of U.S. patent application Ser. No. 08/884,811 filed Jun. 30, 1997 now U.S. Pat. No. 6,209,718 and is incorporated herein by reference.

BACKGROUND OF THE INVENTION

A. Field of the Invention

The present invention is directed toward the field of manufacturing integrated circuits. More particularly, the present invention is related to a method for depositing tungsten-nitride upon an insulator layer.

B. Description of the Background Art

Deposited tungsten nitride has the potential for being conformal and providing good step coverage. Tungsten nitride also serves as an excellent barrier to the diffusion of many metals that are used in integrated circuit metalization processes. Further, the resistivity of tungsten nitride is low in comparison to other metal barriers, such as titanium nitride. Accordingly, it is desirable to use tungsten nitride in several integrated circuit manufacturing applications. Applications in which tungsten nitride is desirable to employ include the formation of diffusion barriers, gate electrodes, and capacitor electrodes.

Traditionally, the deposition of tungsten nitride is achieved by flowing a gaseous mixture including tungsten hexafluoride ($WF_6$) and ammonia ($NH_3$) into a deposition chamber. The chamber contains a wafer onto which the tungsten nitride is to be deposited. The tungsten hexafluoride and ammonia immediately begin to undergo a gas phase reaction to form tungsten nitride. A thermal reaction occurs to combine the nitrogen from the ammonia and the tungsten from the tungsten hexafluoride to form tungsten nitride ($W_2N$).

The above described traditional process for depositing tungsten nitride also results in the formation of contaminant particles in the form of solid byproducts. Several different byproducts have been observed. These byproducts include ammonia adducts of tungsten hexafluoride (($NH_3)_4WF_6$), ammonium fluoride ($NH_4F$) and other ammonium complexes. A range of 90 to 300 of these solid byproduct particles having a diameter of 0.2 $\mu$m or greater are generated each time tungsten hexafluoride and ammonia are combined in a traditional process to deposit tungsten nitride on an eight inch wafer. Many of these particles become attached to the deposition chamber's interior and eventually cause an increase in the number of defective dice produced by the chamber.

Further, the tungsten nitride that is deposited using the above described traditional process has a polycrystalline structure in which there are many grain boundaries. As a result, the diffusion barrier properties of the tungsten nitride are compromised. In addition, tungsten nitride films deposited by the traditional method tend not to adhere very well to the substrate upon which they are deposited. Also, it is well known that $WF_6$ consumes silicon during the transient state reaction. As such, silicon encroachment into the tungsten nitride layer contaminates the layer.

Therefore, a need exists for a process for depositing tungsten nitride with very few contaminant particles per wafer. It is also desirable for a deposition process for tungsten nitride to provide for a layer of tungsten nitride that is more amorphous than traditionally deposited tungsten nitride. Furthermore, it is desirable for a tungsten nitride deposition process to provide for a thin film that more strongly adheres to an oxide layer than traditionally deposited tungsten nitride. As a result, the diffusion barrier characteristics of the tungsten nitride layer will be enhanced over traditionally deposited tungsten nitride.

SUMMARY OF THE INVENTION

In embodiments of the present invention, tungsten nitride is deposited on the upper surface of a substrate such as a semiconductor wafer. The wafer is generally coated, in whole or in part, with an insulator layer such as silicon-dioxide ($SiO_2$) or silicon oxide (SiO). The deposition is performed by providing a gaseous mixture in a chamber that contains a wafer, and energizing the gaseous mixture to form a plasma. The gaseous mixture includes a first gaseous composition containing nitrogen and hydrogen and a second gaseous composition containing tungsten. The first gaseous composition is one that does not have a gas phase reaction with the second gaseous composition to form tungsten nitride, unless energy is provided to the gaseous mixture. The tungsten containing composition may be tungsten hexafluoride ($WF_6$). The first gaseous composition may include a mixture of $N_2$ nitrogen and $H_2$ hydrogen. Additionally, the gaseous mixture may include an argon dilutant.

The gaseous mixture may be energized to form a plasma, by infusing it with energy provided by a signal having a high frequency. In the plasma, the $N_2$ nitrogen dissociates into nitrogen ions, and the tungsten separates from the fluorine. The nitrogen ions and tungsten then combine to form tungsten nitride ($W_2N$). The tungsten nitride reacts with a heated wafer surface in the chamber, so that a layer (or film) of tungsten nitride is deposited on the wafer's upper surface. Tungsten nitride that is deposited in accordance with the present invention is more amorphous than traditionally deposited tungsten nitride and therefore, acts as a better diffusion barrier.

The hydrogen and fluorine combine to form hydrogen fluoride (HF) as a gaseous reaction byproduct that is discarded, i.e., removed from the chamber. Only 30 or fewer contaminant particles per eight inch wafer are generated by depositing tungsten nitride is accordance with the present invention. This reduction in contaminant particles is achieved by eliminating the ammonia reaction in gas phase that forms ammonium containing contaminants.

To improve the adhesion of the tungsten nitride film to the substrate, and especially to a wafer having an insulating layer upon which the tungsten nitride is deposited, the wafer is pretreated with a plasma before depositing the tungsten nitride film. The pretreatment can be accomplished in the same chamber as the tungsten nitride deposition by providing only the first gaseous composition and energizing it to form a plasma. As such, the wafer is pre-treated with a plasma of, for example, hydrogen or a gaseous mixture containing hydrogen. Once the wafer is treated, the tungsten fluoride can be added to the plasma to begin tungsten nitride deposition.

By pretreating the wafer prior to deposition, two substantial improvements are produced. First, the subsequently deposited tungsten nitride layer adheres better to the wafer, especially to the side walls of a via or trench. Secondly, such pretreatment reduces the amount of silicon consumed by the tungsten hexafluoride. Consequently, very little silicon encroachment occurs.

BRIEF DESCRIPTION OF THE DRAWINGS

Further details of the present invention are explained with the help of the attached drawings in which.

DETAILED DESCRIPTION

In accordance with the present invention, a layer (or film) of tungsten nitride is deposited on an upper surface of a partially formed integrated circuit. The integrated circuit may be formed on a substrate that is one of a number of die in a wafer. Generally, all or a portion of the wafer is covered with an insulator layer, for example, a layer of oxide material that is pretreated in accordance with the invention to improve the adhesion of a subsequently deposited tungsten nitride layer.

Figure 1:
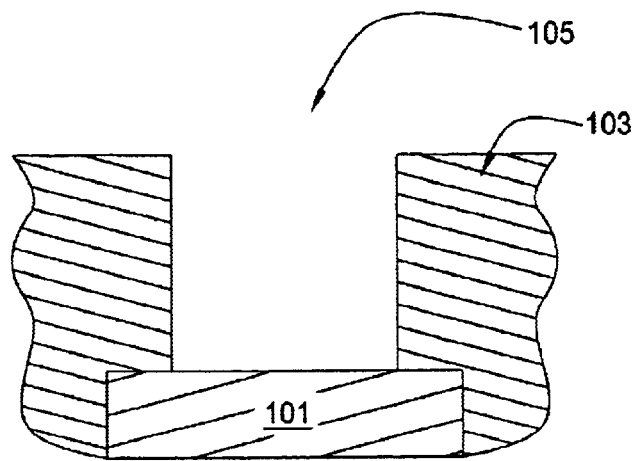
FIG. 1(a) illustrates a cross-sectional view of a via hole in a partially formed integrated circuit extending out from a conductive metal element on a wafer die.
FIG. 1(b) illustrates a cross-sectional view of the partially formed integrated circuit in FIG. 1(a) being exposed to a plasma formed from a gaseous mixture in accordance with the present invention.
FIG. 1(c) illustrates a cross-sectional view of a layer of tungsten nitride deposited on the upper surface of a portion of the partially formed integrated circuit shown in FIG. 1(c).
FIG. 1(d) illustrates a cross-sectional view of a layer of metal deposited on the partially formed integrated circuit shown in FIG. 1(c).
FIG. 1(e) illustrates a cross-sectional view of an interconnect structure in the contact hole shown in FIG. 1(a).
Figure 1:
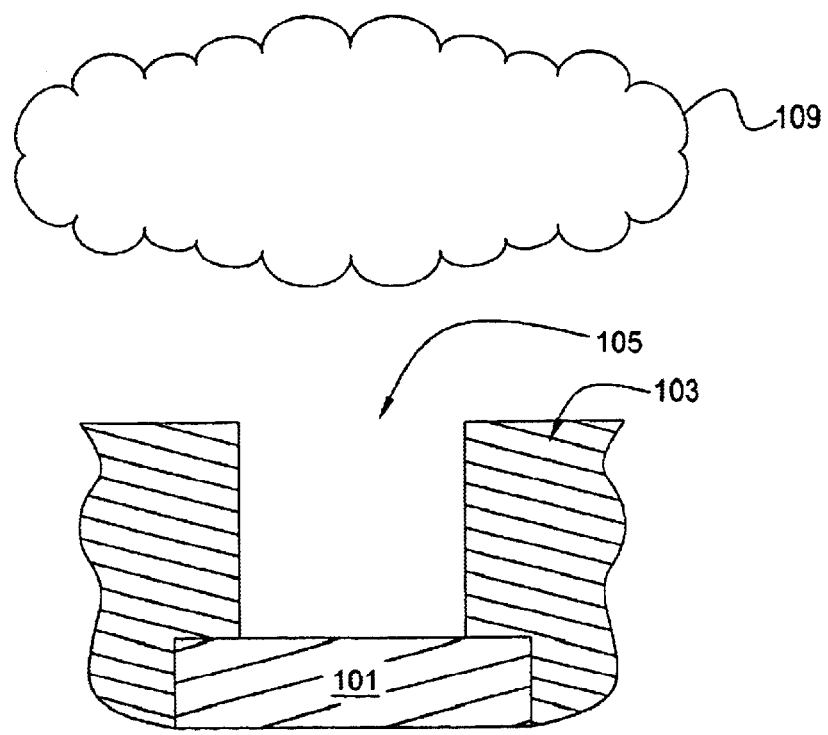
Figure 1:
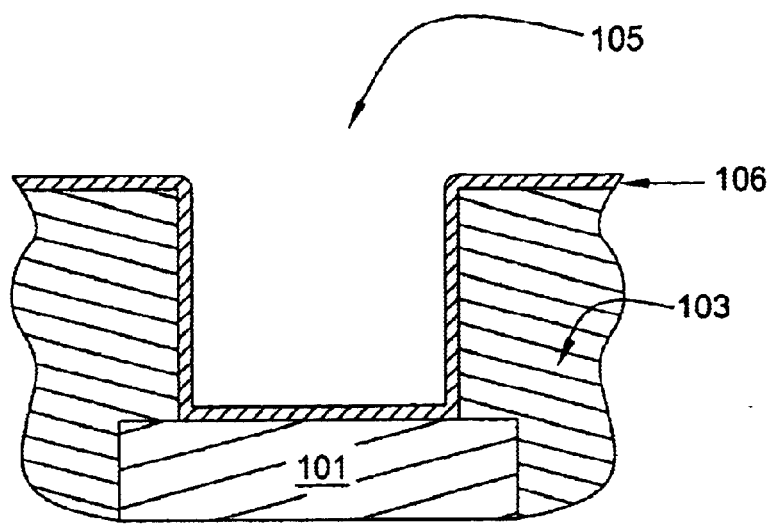
Figure 1:
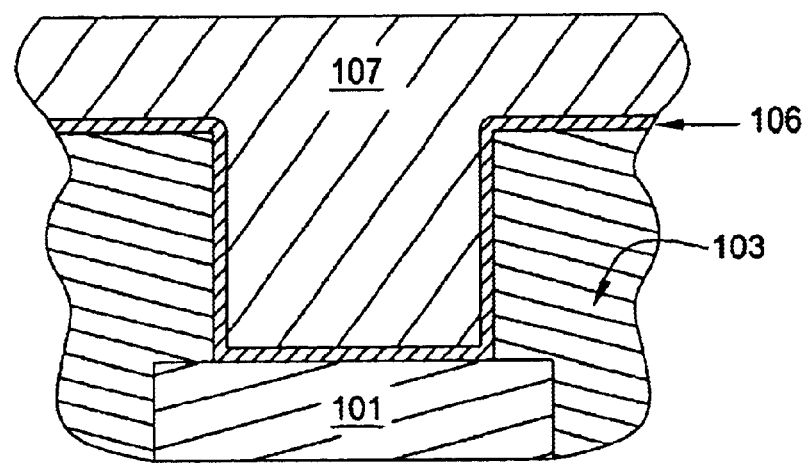
Figure 1:
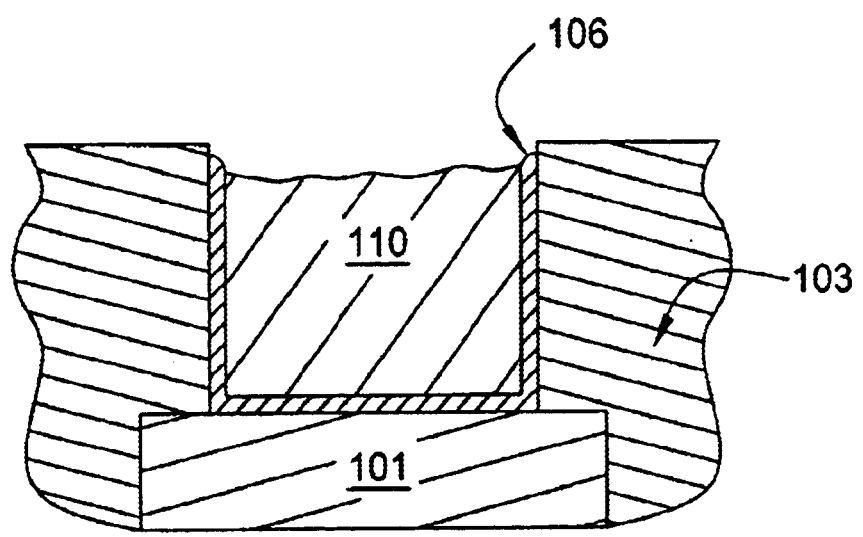

In depositing a layer of tungsten nitride in accordance with the present invention, a wafer is placed in a deposition chamber, such as a plasma enhanced chemical vapor deposition ("PECVD") chamber. The wafer includes a partially formed integrated circuit onto which it is desirable to deposit tungsten nitride. FIG. 1(a) illustrates a cross sectional view of a portion of a partially formed integrated circuit on a wafer onto which tungsten nitride may be deposited to form a diffusion barrier for an interconnect structure such as a plug. The wafer includes a metal component 101, such as a copper metal line, and a layer of insulative material 103, such as silicon oxide or silicon dioxide. The insulative material 103 extends upward from and surrounds the metal component 101 to form a via hole 105. One with ordinary skill in the art will recognize that the integrated circuit cross section shown in FIG. 1(a) is only one possible cross section and that many others are possible. For example, a different cross section may be appropriate for illustrating the deposition of tungsten nitride to form a gate electrode or capacitor electrode.

The wafer containing the partially formed integrated circuit is then exposed to a plasma 109 as shown in FIG. 1(b). The plasma is formed by providing a gaseous mixture and energizing it with energy from a signal having a frequency. The gaseous mixture includes a first gaseous composition containing nitrogen and hydrogen and a second gas composition containing tungsten. The first gaseous composition is one that will not have a gas phase reaction with the second gaseous composition to form tungsten nitride, unless energy is provided to the gaseous mixture. In one embodiment of the present invention, the first gaseous composition contains $H_2$ hydrogen, and the second gaseous composition is tungsten hexafluoride ($WF_6$). The gaseous mixture may also include a dilutant, such as argon (Ar).

To pretreat the wafer prior to tungsten nitride deposition, the first gaseous mixture (e.g., one or more gases containing at least hydrogen with or without nitrogen in the mixture) is flowed into the chamber and energy is applied to form a pretreatment plasma. The preferred embodiment of the invention uses a gaseous mixture of hydrogen and nitrogen as the pretreatment plasma. After a short period of time, the second gaseous mixture is then added to the plasma to begin tungsten nitride deposition onto the wafer. If nitrogen was not used in the first; gaseous mixture, it must be added to the plasma with the second gaseous mixture to facilitate tungsten nitride deposition.

The signal that is applied to form the plasma 109 may have a frequency in the range of 100 kilohertz ("KHz") to 5 gigahertz ("GHz"). The infusion of energy energizes the hydrogen in the first gaseous mixture such that the wafer is effectively "cleaned" prior to tungsten nitride deposition, and the infusion of energy to the combination of the first and second gaseous mixtures enhances the dissociation of $N_2$ nitrogen into nitrogen ions to facilitate tungsten nitride deposition. The energy also fuels the break down of the tungsten hexafluoride, so that the fluorine separates from the tungsten and combines with the hydrogen to form hydrogen fluoride (HF). The nitrogen ions and tungsten combine to form tungsten nitride ($w_2N$).

As illustrated in FIG. 1(c), the tungsten nitride 106 falls to the partially-formed integrated circuit to cover the upper surfaces of the metal component 101 and the insulative material 103 that has been sputtered cleaned by the pretreatment plasma. The portion of the deposited tungsten nitride 106 that overlies the metal component 101 may serve as a diffusion barrier to inhibit the diffusion of a later deposited metal into the metal component 101. In fact, tungsten nitride is an excellent barrier to prevent the diffusion of copper, which is applied in integrated circuit metalization processes.

The hydrogen fluoride (HF) byproduct that is formed in the deposition of the tungsten nitride in exhausted from the chamber in which the deposition is performed. In contrast to the solid byproducts formed by the traditional deposition of tungsten nitride, the HF byproduct is gaseous. Accordingly, the number of contaminant particles that are left behind after the deposition of tungsten nitride in accordance with the present invention are greatly reduced over traditional tungsten nitride deposition processes. In general, the deposition of tungsten nitride in accordance with the present invention results in the generation of only 30 or less particles per eight inch wafer.

As shown in FIG. 1(d), a layer of metal 107, such as copper or tungsten, is deposited to overlie the diffusion barrier layer of tungsten nitride 106. The upper surface of the wafer is then polished to remove both the metal 107 and tungsten nitride 106 from the upper surface of the insulative material 103. The resulting interconnect plug structure 110 is shown in FIG. 1(e). The polishing may be achieved by using chemical mechanical polishing.

Although the above-described process for depositing tungsten nitride has been described with reference to the formation of a diffusion barrier, tungsten nitride deposition in accordance with the present invention may also be employed when depositing tungsten nitride for other purposes. Such other purposes may include the formation of a gate electrode or the formation of a capacitor electrode.

In accordance with the present invention, the deposition of tungsten nitride may be performed in any chamber that provides for plasma enhanced chemical vapor deposition. When tungsten nitride deposition is immediately followed by a metal deposition, it is beneficial for the tungsten nitride deposition chamber to also be capable of depositing the metal. As a result, the plasma treatment and the two depositions may be performed in-situ, and thereby eliminate the need to expose the tungsten nitride to environmental contaminants that can be encountered when transferring wafers between chambers. For example, during a wafer transfer, the tungsten nitride may be exposed to oxygen, thereby causing a native oxide to form which increases the resistivity of the tungsten nitride to unacceptable levels and renders some of the wafer's dice defective.

The CVD chamber manufactured by Applied Materials, Inc. of Santa Clara, Calif. under the trade name WxZ Chamber and described in commonly assigned U.S. patent application Ser. No. 08/680,724, entitled Components Peripheral to the Pedestal in the Gas Flow Path within a Chemical Vapor Deposition Chamber, by Zhao, et al., filed on Jul. 12, 1996, and incorporated herein by reference, may be employed to deposit tungsten nitride in accordance with the present invention.

Figure 2:
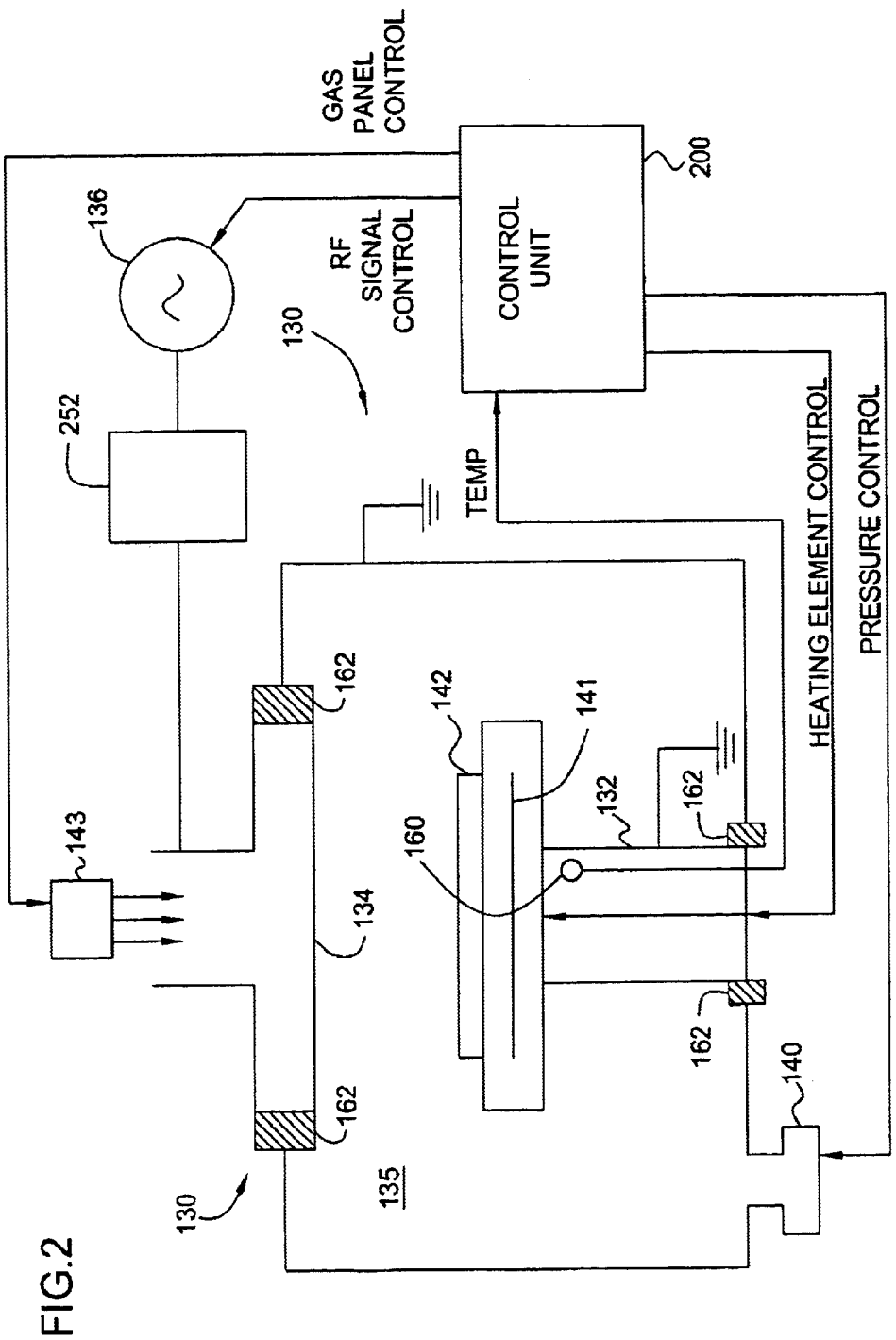
FIG. 2 illustrates a schematic of a chamber that may be deployed for depositing tungsten nitride in accordance with the present invention.

Such a chamber is schematically depicted in FIG. 2. The chamber 130 includes a showerhead 134 for flowing gases into a processing chamber 135 and a wafer support 132 for supporting a wafer that is being processed. The wafer support 132 is heated by a resistive coil (not shown) to set the temperature of the wafer for thermally energized reactions, such as the reactions that take place during chemical vapor deposition.

The wafer support 132 is grounded, and the showerhead 134 is coupled to a signal source 136 through a matching network 252. During the plasma treatment and deposition of tungsten nitride, a gaseous mixture is flowed into the chamber 135 and infused with energy from a signal having a frequency and being provided by the signal source 136 to the showerhead 134. As a result, the gaseous mixture is transformed into a plasma 254 in which, first the hydrogen/nitrogen plasma treats the insulator layer and second tungsten and nitrogen ions combine to form tungsten nitride ($W_2N$). The tungsten nitride then falls to the heated upper surface of a wafer being supported by the wafer support 132 to form a layer of tungsten nitride.

The chamber in FIG. 2 includes a control unit 200 that is coupled to a pressure control unit 140, a gas panel 143, an RF source 136, a heating element 141 and a temperature sensor 160. The control unit 200 monitors the chamber/wafer temperature and controls all the components of the chamber as described below with respect to FIG. 4. The pressure control unit 140, under control of the control unit 200, sets the pressure in the processing chamber 135 and provides an exhaust mechanism for removing reaction byproducts from the processing chamber 135. The walls of the processing chamber 135 are electrically isolated from the showerhead 134 and wafer support 132 by isolators 162.

In one embodiment of the present invention, a wafer 142, onto which tungsten nitride is to be deposited, is placed on the wafer support 132. The wafer 142 is spaced about 0.3 to 0.8 inches, preferably 0.6 to 0.7 inches, from the showerhead 134. The pressure in the processing chamber 135 is set by the pressure control unit 140 to be in a range of 0.1 Torr. to 100 Torr. The temperature of the wafer 142 is set to be in a range of 200° Celsius ("C") to 600° C. The wafer 142 temperature is established by employing a resistive coil in the wafer support 132. However, other means of heating the wafer 142 may be employed such as the use of heat lamps. Further, a temperature sensing device 160, may be employed to measure the temperature of the wafer and/or wafer support and indicate when the appropriate wafer temperature has been reached.

A plasma 144 is generated in the processing chamber 135. In generating the plasma, a gas panel 143 provides a gaseous mixture to the showerhead 134, and the signal source 136 supplies a signal having a frequency to the showerhead 134. The gaseous mixture flows through the showerhead 134 and forms a plasma 144 in the processing chamber 135 containing the wafer 142.

In accordance with the present invention, the preferred gaseous mixture includes a first gas composition containing both nitrogen and hydrogen and a second gas composition containing tungsten. The first gas composition does not, have a gas phase reaction with the second gas composition to form tungsten nitride, unless energy is provided to the gaseous mixture.

In the preferred embodiment of the invention, the first gas composition contains $N_2$ nitrogen and $H_2$ hydrogen and the second gas composition is tungsten hexafluoride ($WF_6$). The gaseous mixture also includes an argon (Ar) dilutant. The nitrogen and hydrogen are each provided at a flow rate in the range of 1 standard cubic centimeter per minute ("scdm") to 5,000 sccm, and the flow rate of the argon dilutant is in a range of 1 sccm to 5,000 sccm. The nitrogen and hydrogen are supplied to the chamber to form a treatment plasma for 15 to 30 seconds before the tungsten hexafluoride is supplied to the chamber. The tungsten hexafluoride in the gaseous mixture is supplied at a flow rate in a range of 1 sccm to 100 sccm.

The energy from the signal first excites the hydrogen such that the hydrogen and nitrogen effectively treat (i.e., sputter clean) the insulator layer surface and then promotes the dissociation of nitrogen into nitrogen ions. The energy also promotes the reduction of the tungsten hexafluoride into tungsten, which combines with the nitrogen ions, and fluorine, which combines with the hydrogen. As a result, the tungsten and nitrogen combine to form tungsten nitride ($W_2N$), and the hydrogen and fluorine combine to form hydrogen fluoride (HF).

In accordance with the present invention, the signal that is provided by the signal source 136 to form the plasma has a frequency in the range of 100 KHz to 5 GHz. The power of the signal is in a range of 1 watt to 5 kilowatts. Preferably, the signal's power is in a range of 100 watts to 1 kilowatt. The treatment plasma is maintained for a period of between 15 and 30 seconds and the deposition plasma is maintained for a period of time between 5 and 600 seconds.

The repeated cycling of voltage from the signal source 136 results in a surplus of electrons in the vicinity of the wafer 142 that produce a negative bias at the wafer 142. The showerhead 134 may acquire a negative bias between −200 to −450 volts, typically −400 volts. The processing chamber 135 and the wafer support 132 are grounded, and the negative bias of the wafer is between −100 to −250 volts, typically 200 volts, which remains approximately constant during the time that the plasma is maintained. The voltage gradient directs the tungsten nitride that is formed in the plasma onto the surface of the wafer 142.

The newly formed tungsten nitride deposits on the upper surface of the wafer 142, and once the plasma generation is completed the hydrogen fluoride (HF) is exhausted from the processing chamber 135 by the pressure control unit 140. As a result of tungsten nitride being deposited on an eight; inch wafer, in accordance with the present invention, the number of contaminant particles that are generated is 30!or less.

When the chamber shown in FIG. 2 is used to deposit tungsten nitride as a diffusion barrier for an interconnect structure, the deposition of the metal for the interconnect structure may also be deposited on the wafer 142 in the same processing chamber 135 as the tungsten nitride. Accordingly, the tungsten nitride diffusion barrier and metal may be deposited in situ, so that the wafer is not removed from the processing chamber 135 between depositing tungsten nitride and depositing metal. This minimizes the exposure of the wafer 142 to contaminants outside of the processing chamber 135.

The interconnect structure being formed may be a plug which includes a tungsten nitride diffusion barrier overlaid by a metal, such as copper or tungsten. In order to form such an interconnect structure, the metal is deposited on the upper surface of the previously deposited layer of tungsten nitride 150. Traditional deposition processes, such as chemical vapor deposition, may be employed to deposit the metal.

When depositing the metal on wafer 142 in processing, chamber 135, the temperature of the wafer 142 is set to be in a range of 200° C. to 600° C., and the pressure in the processing chamber 135 is set to be in a range of 0.01 Torr. to 50 Torr. The gas panel 143 provides a metal based gaseous mixture 151 to the showerhead 134. The showerhead 134 flows the gaseous mixture 151 into the processing chamber 135 where the wafer 142 resides. The gaseous mixture 151 may include both a gaseous metal and an argon dilutant. When the metal being deposited is tungsten, the gaseous mixture 151 may include tungsten hexafluoride, nitrogen, and hydrogen. The flow rate of the tungsten hexafluoride may be in a range of 1 sccm to 100 sccm, while the flow rate of the nitrogen and hydrogen are in a rang of 1 sccm to 5,000 sccm. The flow rate of argon may be in the range of 1 sccm to 5,000 sccm.

The exposure of the gaseous mixture 151 to the heated wafer surface causes a heat-induced chemical reaction to take place. As a result, a layer of metal 153 is formed over the upper surface of the tungsten nitride 150. Once the metal is deposited, the pressure control unit 140 causes the metal deposition reaction byproducts to be exhausted from the processing chamber 135. At this point, the wafer 142 may be removed from the processing chamber 135 and transferred to a machine for removing undesired portions of the tungsten nitride 150 and metal 153.

As described above, hydrogen fluoride (HF) is produced as a byproduct of the reaction between tungsten hexafluoride and the second gaseous composition containing hydrogen and nitrogen. When practicing embodiments of the present invention, a gaseous fluorine byproduct may also be produced from the reaction of tungsten hexafluoride, nitrogen, and hydrogen. The fluorine is produced in addition to the hydrogen fluoride, because there may not be enough hydrogen to bond with all of the fluorine from the tungsten hexafluoride.

In some instances, the excess fluorine diffuses into the partially formed integrated circuit on the wafer. This can increase the resistivity of the layers of material into which the fluorine diffuses. Further, when tungsten nitride is being deposited in accordance with the present invention to form a gate electrode, the fluorine byproduct may diffuse through an underlying gate and increase the thickness of a gate oxide. An overly thick gate oxide can render a transistor inoperable.

In further embodiments of the present invention, an additional gas may be added during deposition to the second gaseous composition containing hydrogen and nitrogen to provide for the absorption of the excess fluorine. The additional gas may either be used in conjunction with or as a substitute for the hydrogen in the second gaseous composition when used in the deposition plasma. In accordance with the present invention, the additional gas may be a hydride of Group III or V. In one embodiment, diborane $B_2H_6$ is employed as the additional gas.

When generating the deposition plasma, the second gaseous composition may include $N_2$ nitrogen, $H_2$ hydrogen, and $B_2H_6$ diborane. The $B_2H_6$ may be provided at a flow rate in a range of 1 sccm to 30 sccm, and all other conditions maybe kept the same as described above with reference to FIG. 2. In the plasma, each boron atom combines with three fluorine atoms, and each hydrogen atom combines with only one fluorine atom. As a result, HF and $BF_3$ are produced as gaseous byproducts, while tungsten nitride is deposited. The boron's absorption of the fluorine reduces the level of fluorine byproduct that is produced. This reduces the adverse affects caused by fluorine byproduct, such as increased resistivity and gate oxide thickness. Ideally, the concentration of fluorine may be reduced to a level in a range of $1\times10^{17}$ to $1\times10^{19}$ atoms per mole.

However, $B_2H_6$ is a highly toxic chemical. There are many safety considerations to be taken into account when using $B_2H_6$. Accordingly, the use of $B_2H_6$ may be limited to situations where it is critical to minimize the amount of fluorine byproduct that is generated. For example, the need to limit the amount of fluorine when forming a gate electrode may be more critical in some instances than the need for limiting the amount of fluorine when forming a plug's diffusion barrier. This is due to the severe adverse affect that fluorine can have on the thickness of a gate oxide that underlies the gate electrode.

Figure 3:
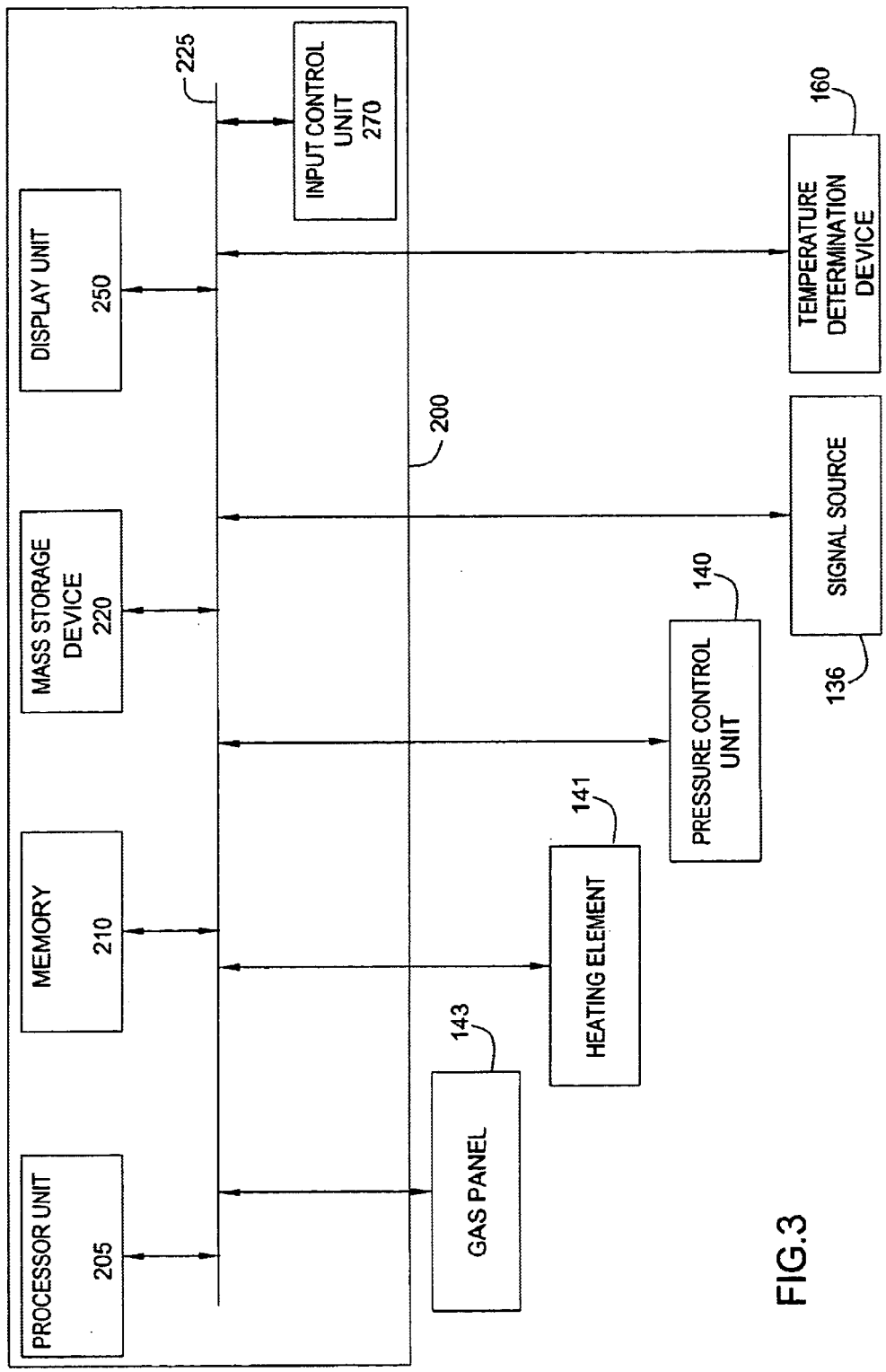
FIG. 3 illustrates a control unit for controlling a chamber that is used for depositing tungsten nitride in accordance with the present invention.

In accordance with the present invention, the wafer may be plasma treated and tungsten nitride may be deposited in a chamber that is controlled by a processor-based control unit. FIG. 3 illustrates a control unit 200 that may be employed in such a capacity. The control unit 200 includes a processor unit 205, a memory 210, a mass storage device 220, an input control unit 270, and a display unit 250 which are all coupled to a control unit bus 225.

The processor unit 205 may be a microprocessor or other engine that is capable of executing instructions stored in a memory, e.g., a 680×0 microprocessor manufactured by Motorola, Inc. The memory 210 may be comprised of a hard disk drive, random access memory ("RAM"), read-only memory ("ROM"), a combination of RAM and ROM, or other memory. The memory 210 contains instructions that the processor unit 205 executes to facilitate the performance of the above-mentioned process steps for depositing tungsten nitride in accordance with the present invention. The instructions in the memory 210 may be in the form of program code. The program code may conform to any one of a number of different programming languages. For example the program code may be written in C+, C++, BASIC, Pascal, or a number of other languages.

The mass storage device 220 stores data and instructions and retrieves data and instructions from a processor readable storage medium, such as a magnetic disk or magnetic tape. For example, the mass storage device 220 may be a hard disk drive, floppy disk drive, tape drive, optical disk drive, or compact disk read only memory ("CD-ROM") drive. The mass storage device 220 stores and retrieves the instructions in response to directions that it receives from the processor unit 205. Data and instructions that are stored and retrieved by the mass storage unit 220 may be employed by the processor unit 205 for performing tungsten nitride deposition. The data and instructions may first, be retrieved by the mass storage device 220 from a medium and then transferred to the memory 210 for use by the processor unit 205.

The display unit 250 provides information to a chamber operator in the form of graphical displays and alphanumeric characters under the control of the processor unit 205. The input control unit 270 couples a data input device, such: as a keyboard, mouse, or light pen, to the control unit 200 to provide for the receipt of a chamber operator's inputs.

The control unit bus 225 provides for the transfer of data and control signals between all the devices that are coupled to the control unit bus 225. Although the control unit bus 225 is displayed as a single bus that directly connects to the devices in the control unit 200, the control unit bus 225 may be a collection of buses. For example, the display unit 250, input control unit 270 and mass storage device 220 may be coupled to an input-output peripheral bus, while the processor unit 205 and memory 210 are coupled to a local processor bus. The local processor bus and input-output peripheral bus may be coupled together to form the control unit bus 225.

The control unit 200 is coupled to the elements of a chamber for depositing a layer of tungsten nitride in accordance with the present invention, such as the chamber shown in FIG. 2. Each of the chamber's elements may be coupled to the control unit bus 225 to facilitate communication between the control unit 200 and the respective element. These chamber elements, as set forth with reference to FIG. 2, include the gas panel 143, heating element 141, such as a resistive coil, pressure control unit 140, signal source 136, and temperature determination device 160. The control unit 200 provides signals to the chamber elements that cause the elements to perform the operations described above for the process steps of treating the wafer and depositing tungsten nitride in accordance with the present invention. The control unit 200 may also receive signals from these elements to determine how to proceed in controlling the deposition of tungsten nitride. For example, the control unit 200 receives signals from the temperature termination device 160 to determine the amount of heat that the heating element 141 should provide.

Figure 4:
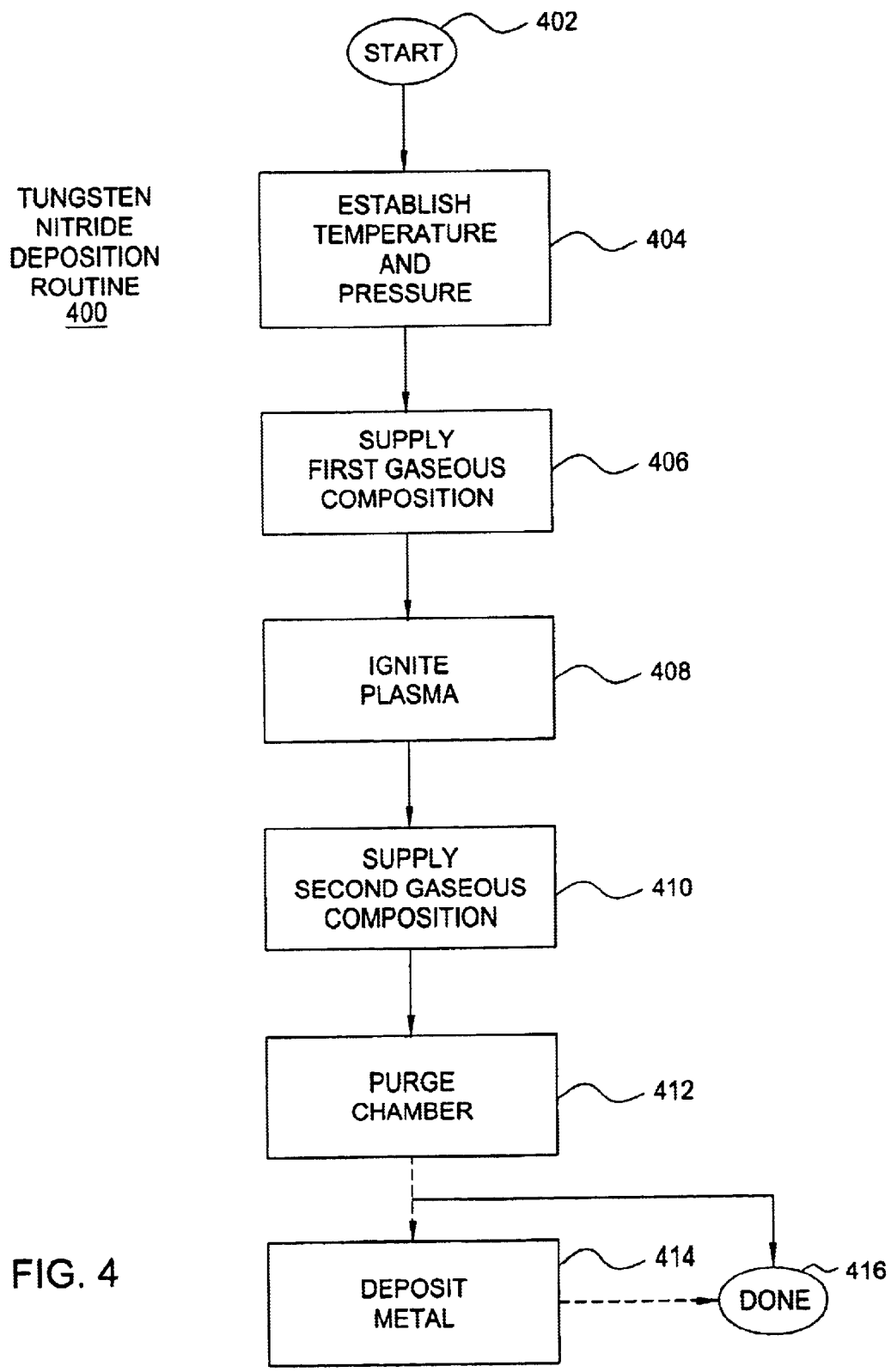
FIG. 4 illustrates a sequence of operations performed by the control unit shown in FIG. 4 in accordance with the present invention.

FIG. 4 illustrates a sequence of process steps (a tungsten nitride deposition routine 400) that may be performed by the processor unit 205 in response to program code instructions that it receives from the memory 210. Upon initiating (at step 402) the deposition of tungsten nitride, the processing chamber 135 temperature and pressure are established in step 404. In setting the pressure and temperature, the processor unit 205 executes instructions received from the memory 210. The execution of these instructions results in elements of the chamber being operated to set the wafer temperature and the chamber pressure.

For example, the processor unit 205, in response to the retrieved instructions, causes the pressure control unit 140 to set the processing chamber 135 pressure to be in a range of 0.1 Torr. to 100 Torr. The processor unit 205 also instructs the heating element 141 to heat the wafer to a temperature in a range of 200° C. to 600° C.

Once the processing chamber's temperature and pressure have been established, the processor unit 205 executes instructions from the memory 210 which cause, at step 406, the chamber elements to flow a first gaseous mixture into the chamber and, at step 408, provide a signal having a frequency to supply energy to the first gaseous mixture for igniting a plasma. For example, the gas panel 143 is controlled, at step 406 to provide a first gaseous mixture containing nitrogen and hydrogen, as described above to form a wafer treatment plasma.

Further, in step 408, the processor unit 205 instructs the signal source 136 to provide a signal to the showerhead 134 having a frequency in the range of 100 KHz to 5 GHz with a power in a range of 1 watt to 5 kilowatts. The processor unit 205 causes such a signal to be provided for a time in the range of 15 to 30 seconds. Thereafter, the processor unit 205 causes, at step 410, the gas panel 143 to supply tungsten hexafluoride and argon to the showerhead 134. As such, tungsten nitride is deposited upon the wafer. The deposition process lasts for a time in the range of 5 to. 600 seconds.

Once the generation and maintenance of the plasma is completed, the interior of the chamber is purged in step 412. The processor unit 205 instructs the processor control unit 140 to remove all reaction byproducts from the processing chamber 135. Once the processing chamber 135 has been purged, the deposition of tungsten nitride is completed. Thereafter, the chamber can be optionally used, at step 414, to deposit a metal upon the tungsten nitride as described above. Once the metal is deposited, the process is complete at step 416. The wafer can then be removed and planarized to complete the interconnect structure.

The deposition of tungsten nitride in accordance with the present invention results in the generation of fewer contaminant particles. Additionally, the addition of a plasma treatment process prior to tungsten nitride deposition improves the adhesion of the tungsten nitride layer to the wafer and especially to oxide coated portions of the wafer. Specifically, tungsten nitride films deposited in accordance with the present invention have improved adhesion over films deposited without treatment as measured by the standard "cellophane tape" test.

Furthermore, tungsten nitride films deposited after treatment of the wafer with a hydrogen/nitrogen plasma exhibit reduced silicon encroachment into the tungsten nitride film. This effect may be related to nitrogen passivation of the Si surface which prevents fluorine containing species in the deposition plasma from reacting with silicon during the initial stage of tungsten nitride deposition or the effect may relate to hydrogen reduction of the $WF_6$ in lieu of silicon reduction of the $WF_6$ during the initial stage of tungsten nitride deposition.

The present invention has been described as a plasma, treatment of the wafer prior to tungsten nitride deposition using either a hydrogen/nitrogen combination or diborane as the reducing agent. The improved adhesion resulting from the plasma treatment of an oxide layer will occur for a tungsten nitride film that is deposited in any manner including reducing tungsten hexafluoride with ammonia or using an organo-metallic precursor in a thermal decomposition process.

Although the present invention has been described in terms of specific exemplary embodiments, it will be appreciated that various modifications and alterations might be made by those skilled in the art without departing from the spirit and scope of the invention as specified by the following claims.

What is claimed is:

1. A method for depositing a layer of material on a surface of a substrate in a processing chamber, said method comprising the steps of:
   (a) providing a first gaseous composition containing a hydrogen gas;
   (b) providing energy to said first gaseous composition to form a treatment plasma that treats the surface of said substrate; and
   (c) providing a gaseous mixture in the processing chamber, wherein said gaseous mixture includes a second gaseous composition comprising tungsten and a third gaseous composition comprising molecular nitrogen and hydrogen;
   (d) forming a deposition plasma from said gaseous mixture in the processing chamber; and
   (e) depositing tungsten nitride produced by said plasma onto said surface of said substrate.

2. The method of claim 1, wherein said first gaseous composition consists of hydrogen and nitrogen.

3. The method of claim 2, wherein said second gaseous composition includes tungsten hexafluoride.

4. The method of claim 3, wherein said second gaseous composition is provided at a flow rate in a range of 1 sccm to 100 sccm.

5. The method of claim 3, wherein said hydrogen of said first gaseous composition is provided at a flow rate in a range of 1 sccm to 5,000 sccm and said nitrogen 4 said first gaseous composition is provided at a flow rate in a range of 1 sccm to 5,000 sccm.

6. The method of claim 5, wherein said gaseous mixture includes argon.

7. The method of claim 6 wherein said argon is provided at a flow rate in a range of 1 sccm to 5,000 sccm.

8. The method of claim 2, wherein said deposition plasma is generated for a time in a range of 5 seconds to 600 seconds.

9. The method of claim 8 wherein said treatment plasma for pretreatment is maintained for a period of time of between 15 and 30 seconds.

10. The method of claim 9, wherein a frequency used to form said treatment plasma and deposition plasma is in a range of 100 KHz to 5 GHz.

11. The method of claim 1 wherein said surface contains an oxide layer.

12. The method of claim 1, further including the step of:
   (f) depositing a layer of metal on an upper surface of said tungsten nitride, while said tungsten nitride is in said processing chamber.

13. The method of claim 1, further including the steps of:
   (f) setting a pressure in said processing chamber to be within a range of 0.1 Torr to 100 Torr; and
   (g) setting a temperature of said substrate to be within a range of 200° C. to 600° C.

14. The method of claim 1, wherein said layer of material is a diffusion barrier.

15. The method of claim 1, wherein said third gaseous composition does not have a gas phase reaction with said second gaseous composition to form tungsten nitride, unless a plasma of said gaseous mixture is formed.

16. A method for depositing a layer of material on a surface of a substrate in a processing chamber, said method comprising the steps of:
   (a) providing a first gaseous composition comprising a hydrogen gas and molecular nitrogen gas;
   (b) providing energy to said first gaseous composition to form a treatment plasma to treat said surface of said substrate;
   (c) providing a second gaseous composition comprising tungsten hexafluoride that mixes with said first gaseous composition to form a gaseous mixture; and
   (d) continuing to provide energy to said gaseous mixture in the processing chamber to form a deposition plasma for depositing tungsten nitride upon said treated surface of said substrate.

17. The method of claim 16, wherein said second gaseous composition is provided at a flow rate in a range of 1 sccm to 100 sccm.

18. The method of claim 16, wherein said hydrogen is provided at a flow rate in a range of 1 sccm to 5,000 sccm and said nitrogen is provided at a flow rate in a range of 1 sccm to 5,000 sccm.

19. The method of claim 16, wherein said deposition plasma is generated for a time in a range of 5 seconds to 600 seconds.

20. The method of claim 16 wherein said plasma for treatment is maintained for a period of time of between 15 and 30 seconds.

21. The method of claim 16, wherein said gaseous mixture includes argon.

22. The method of claim 16, wherein a frequency used to form said treatment plasma and deposition plasma is in a range of 100 KHz to 5 GHz.

23. The method of claim 16, further including the steps of:
   (e) setting a pressure in said processing chamber to be within a range of 0.1 Torr to 100 Torr; and
   (f) setting a temperature of said substrate to be within a range of 200° C. to 600° C.

* * * * *